United States Patent
Nguyen et al.

(10) Patent No.: US 12,009,921 B2
(45) Date of Patent: Jun. 11, 2024

(54) SPECTRAL CONTENT DETECTION FOR EQUALIZING INTERLEAVED DATA PATHS

(71) Applicant: Marvell Asia Pte Ltd, Singapore (SG)

(72) Inventors: Ray Luan Nguyen, Fountain Valley, CA (US); Dawood Alam, Lake Forest, CA (US); Nong Fan, Irvine, CA (US); Geoffrey Hatcher, Lake Forest, CA (US); Morteza Azarmnia, Irvine, CA (US)

(73) Assignee: Marvell Asia Pte Ltd, Singapore (SG)

( * ) Notice: Subject to any disclaimer, the term of this patent is extended or adjusted under 35 U.S.C. 154(b) by 27 days.

(21) Appl. No.: 17/813,828

(22) Filed: Jul. 20, 2022

(65) Prior Publication Data
US 2023/0035036 A1 Feb. 2, 2023

Related U.S. Application Data

(60) Provisional application No. 63/224,281, filed on Jul. 21, 2021.

(51) Int. Cl.
*H04L 1/00* (2006.01)
*H04B 1/08* (2006.01)
*H04B 1/16* (2006.01)

(52) U.S. Cl.
CPC ............ *H04L 1/0071* (2013.01); *H04B 1/08* (2013.01); *H04B 1/1607* (2013.01)

(58) Field of Classification Search
None
See application file for complete search history.

(56) References Cited

U.S. PATENT DOCUMENTS 7,593,449 B2 * 9/2009 Shattil ................. H04L 27/2601
375/150
9,319,058 B1 4/2016 Yu et al.
(Continued)

FOREIGN PATENT DOCUMENTS

WO WO 2017/001008 1/2017

OTHER PUBLICATIONS

Konuk, B., et al., "Calibration and Equalization Methods for Mismatch Errors in a High Frequency Two-channel Time-interleaved ADC," *Circuits and Systems (MWSCAS), IEEE 55th International Midwest Symposium*, pp. 258-261 (2012).

*Primary Examiner* — Daniel F. McMahon

(57) ABSTRACT

A high-speed data receiver includes interleaver circuitry configured to divide a received data stream into a plurality of interleaved paths for processing, spectral content detection circuitry configured to derive spectral content information from data on each of the plurality of interleaved paths, sorting circuitry configured to bin the derived spectral content information according to energy levels, stream attribute determination circuitry configured to determine, based on sorted spectral content, one or more of path offsets of the interleaved paths, gain mismatch among interleaved paths, signal bandwidth mismatch and pulse width mismatch, and equalization circuitry configured to correct the one or more of the determined offsets, the determined gain mismatch and the determined signal width mismatch. Equalization circuitry may be configured to equalize a gain-normalized signal by separately adjusting respective bandwidth actuators of each respective interleaved path and respective pulse width actuators of each respective interleaved path.

24 Claims, 11 Drawing Sheets

(56) References Cited

U.S. PATENT DOCUMENTS

| | | | |
|---|---|---|---|
| 2005/0220003 A1* | 10/2005 | Palaskas | H04B 1/30 370/210 |
| 2007/0133719 A1* | 6/2007 | Agazzi | H03M 1/44 375/350 |
| 2013/0115903 A1* | 5/2013 | Kroeger | H04B 7/0885 455/193.1 |
| 2014/0152477 A1* | 6/2014 | Lewis | H03M 1/1061 341/122 |
| 2015/0263749 A1 | 9/2015 | Ramakrishnan et al. | |
| 2019/0280910 A1* | 9/2019 | Sun | H03H 17/06 |

\* cited by examiner

SPECTRAL CONTENT DETECTION FOR EQUALIZING INTERLEAVED DATA PATHS

CROSS REFERENCE TO RELATED APPLICATION

This disclosure claims the benefit of commonly-assigned U.S. Provisional Patent Application No. 63/224,281, filed Jul. 21, 2021, which is hereby incorporated by reference herein in its entirety.

FIELD OF USE

This disclosure relates to detecting and correcting mismatches between interleaved data paths. More particularly, this disclosure relates to detecting mismatches between interleaved data paths based on sorted spectral data, and correcting the detected mismatches.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

As communication and general data acquisition systems become more complex and the need to scale bandwidth ever higher to match the increasing sampling rates continue to rapidly rise in high-speed systems such as including but not limited to methods and systems for Track-and-Hold (TAH), Sample-and-Hold (SAH), Analog-to-Digital Conversion (ADC), Digital-to-Analog Conversion (DAC), optical systems, serializer/deserializer (SERDES) in integrated circuits or image capturing, interleaving—including spatial interleaving and time interleaving—is used to increase throughput. However, interleaved systems suffer from both passive and dynamic sampling effects. These effects include linear offset and gain mismatch errors, bandwidth and settling mismatches, sampling pulse-width mismatches, and intersymbol interference (ISI).

SUMMARY

In accordance with implementations of the subject matter of this disclosure, a high-speed data receiver includes interleaver circuitry configured to divide a received data stream into a plurality of interleaved paths for processing, spectral content detection circuitry configured to derive spectral content information from data on each of the plurality of interleaved paths, sorting circuitry configured to bin the derived spectral content information according to energy levels, stream attribute determination circuitry configured to determine, based on sorted spectral content, one or more of path offsets of the interleaved paths, gain mismatch among interleaved paths, signal bandwidth mismatch and pulse width mismatch, and equalization circuitry configured to correct the one or more of the determined offsets, the determined gain mismatch and the determined signal width mismatch.

In a first implementation of such a high-speed data receiver, the stream attribute determination circuitry may include offset determination circuitry configured to determine offsets between the interleaved paths from mismatches at a lowest energy level.

In a second implementation of such a high-speed data receiver, the stream attribute determination circuitry may include signal width mismatch detection circuitry configured to determine mismatch between at least one of bandwidth and pulse width using a spectral shape function.

According to a first aspect of that second implementation, the signal width mismatch determination circuitry may include circuitry configured to independently sweep respective signal width actuators of each respective interleaved path.

In a third implementation of such a high-speed data receiver, the stream attribute determination circuitry may include gain mismatch determination circuitry configured to determine gain mismatches between the interleaved paths from mismatches at energy levels above the lowest energy level.

According to a first aspect of that third implementation, the gain mismatch determination circuitry may include circuitry configured to independently sweep respective gain actuators of each respective interleaved path.

According to a second aspect of that third implementation, the equalization circuitry may be configured to remove gain mismatch by normalizing a predetermined number of lowest-energy bins.

In a first instance of that second aspect, the equalization circuitry may be configured to equalize the gain-normalized signal by adjusting respective signal width actuators of each respective interleaved path.

In a first variant of that first instance, the equalization circuitry may be configured to equalize the gain-normalized signal by separately adjusting respective bandwidth actuators of each respective interleaved path and respective pulse width actuators of each respective interleaved path.

In a second variant of that first instance, the equalization circuitry may be configured to equalize the gain-normalized signal by adjusting sampling locations on each respective interleaved path.

According to that second variant, the equalization circuitry may be configured to equalize the gain-normalized signal by adjusting sampling locations on each respective interleaved path to set equal pulse widths on all interleaved paths.

In a second instance of the second aspect, the equalization circuitry may be configured to equalize the gain-normalized signal by adjusting coefficients of a fitting polynomial.

In a fourth implementation of such a high-speed data receiver, the sorting circuitry may include Fast Fourier Transform circuitry configured to derive the spectral content information from the data on each of the plurality of interleaved paths.

In accordance with implementations of the subject matter of this disclosure, a method of equalizing parallel interleaved data paths in a high-speed data receiver includes deriving spectral content information from data on each of the plurality of interleaved paths, binning the derived spectral content information according to energy levels, determining, based on sorted spectral content, one or more of path offsets of the interleaved paths, gain mismatch among interleaved paths, signal bandwidth mismatch and pulse width mismatch, and correcting the one or more of the determined offsets, the determined gain mismatch and the determined signal width mismatch.

In a first implementation of such a method, determining, based on sorted spectral content, one or more of path offsets of the interleaved paths, gain mismatch among interleaved paths, signal bandwidth mismatch and pulse width mismatch may include determining offsets among the interleaved paths from mismatches at a lowest energy level.

In a second implementation of such a method, determining, based on sorted spectral content, one or more of path offsets of the interleaved paths, gain mismatch among interleaved paths, signal bandwidth mismatch and pulse width mismatch may include determining mismatch in at least one of bandwidth and pulse width among the interleaved paths using a spectral shape function.

In a third implementation of such a method, determining mismatch in at least one of bandwidth and pulse width comprises independently sweeping respective signal width actuators of each respective interleaved path.

In a fourth implementation of such a method, determining, based on sorted spectral content, one or more of path offsets of the interleaved paths, gain mismatch among interleaved paths, signal bandwidth mismatch and pulse width mismatch may include determining gain mismatches among the interleaved paths from mismatches at energy levels above the lowest energy level.

According to a first aspect of that fourth implementation, determining gain mismatches may include independently sweeping respective gain actuators of each respective interleaved path.

According to a second aspect of that fourth implementation, correcting the determined gain mismatch may include removing gain mismatch by normalizing a predetermined number of lowest-energy bins.

In a first instance of that second aspect, correcting the determined signal width mismatch may include adjusting respective signal width actuators of each respective interleaved path.

In a first variant of that first instance, correcting the determined signal width mismatch may include separately adjusting respective bandwidth actuators of each respective interleaved path and respective pulse width actuators of each respective interleaved path.

In a second variant of that first instance, correcting the determined signal width mismatch may include adjusting sampling locations on each respective interleaved path.

According to that second variant, correcting the determined signal width mismatch may include adjusting sampling locations on each respective interleaved path to set equal pulse widths on all interleaved paths.

According to a third aspect of that fourth implementation, correcting the determined signal width mismatch may include adjusting coefficients of a fitting polynomial.

In a fifth implementation of such a method, binning the derived spectral content information according to energy levels may include applying a Fast Fourier Transform.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

In accordance with implementations of the subject matter of this disclosure, spectral techniques can be used to detect and correct various forms of mismatch, such as those of the types described above (e.g., linear offset and gain mismatch errors, bandwidth and settling mismatches, sampling pulse-width mismatches, and ISI), in time-interleaved (TI) or spatially-interleaved (SI) systems. In some implementations, a Fast Fourier Transform may be used for spectral detection and estimation.

Figure 1:
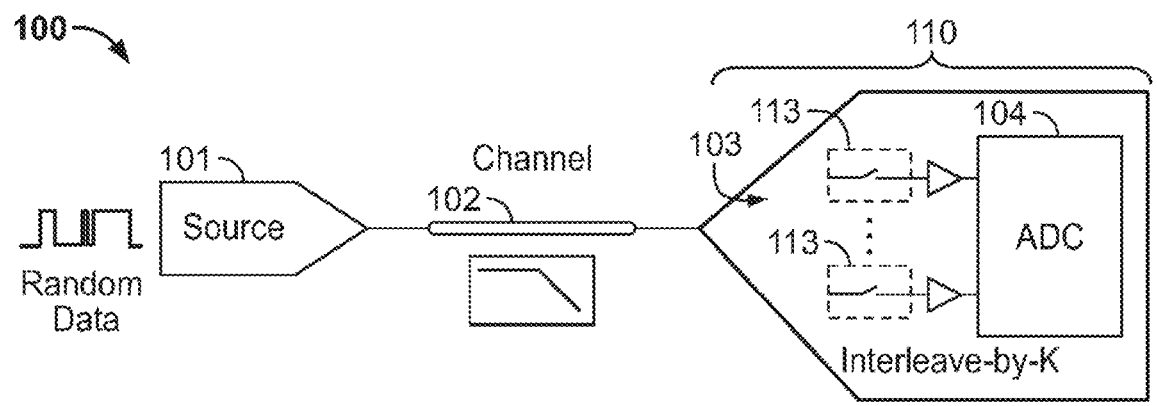
FIG. 1 shows a data channel with which implementations of the subject matter of this disclosure may be used.

FIG. 1 shows a general sampling system 100 where sample values are acquired from a remote source 101 over a channel 102. Receiver 110 includes a network 103 of K interleaved TAH or SAH paths 113, which are subsequently digitized by an ADC 104. Each sample value may contain information regarding sampling imperfections such as offset, gain, bandwidth, sampling pulse-width, interference from adjacent samplers (either in time or in space), and content above the Nyquist limit that are folded down into its first Nyquist zone. Each acquired sample is an aggregated sum of all these sources of imperfection into a single value that cannot by itself be used to recognize or distinguish these sources of imperfection.

However, in accordance with implementations of the subject matter of this disclosure, broadband spectrum analysis over multiple ones of the sample values can be used to distinguish associated TI or SI artifacts based on frequency content. For ease of illustration, the discussion that follows will focus on spectral techniques applicable to TI systems, but the same principles apply as well to SI systems without loss of generality.

Samples of different TI elements have different spectral energy content that can be detected using, e.g., Fast Fourier Transform (FFT) circuitry. The different spectral energy components can be binned based on the FFT output. If different TI elements have different offsets, they will have different FFT Bin 0 energy content, and therefore the offsets can be discerned from gain errors. If there are interleaved gain errors aside from offsets, those interleaved gain errors can be discerned after the offsets are removed from the data samples. Offsets can be removed either by subtracting each data samples from an average value, or calibrating Bin 0 to a minimum level. Subsequently, the sum of energy in bins other than Bin 0—i.e., from Bin 1 to the Nyquist limit—can be used to calibrate for gain mismatches.

Mathematically, this can be expressed as:

$$|B_0^0| = \ldots = |B_0^{K-1}| \qquad (1)$$

$$\|(B_1^0, \ldots, B_{N-1}^0)\|^m = \ldots = \|(B_1^{K-1}, \ldots, B_{N-1}^{K-1})\|^m \qquad (2)$$

where m=1 or m=2 to denotes either the first or second order norm of bins 1, . . . , N−1.

Figure 2:
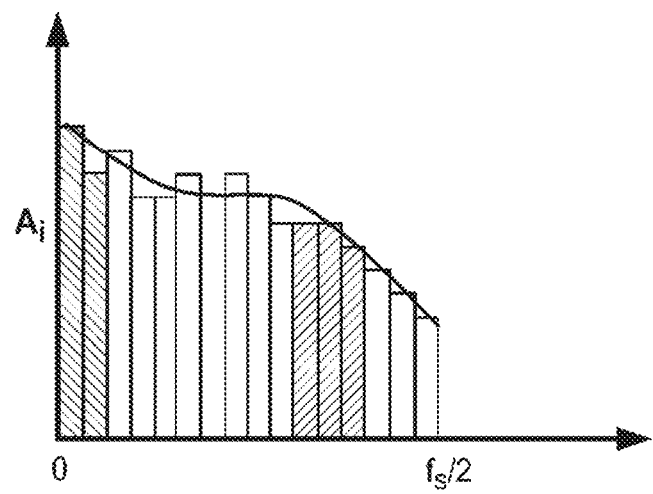
FIG. 2 shows a first sampled energy spectrum illustrating principles in accordance with the subject matter of this disclosure.
Figure 3:
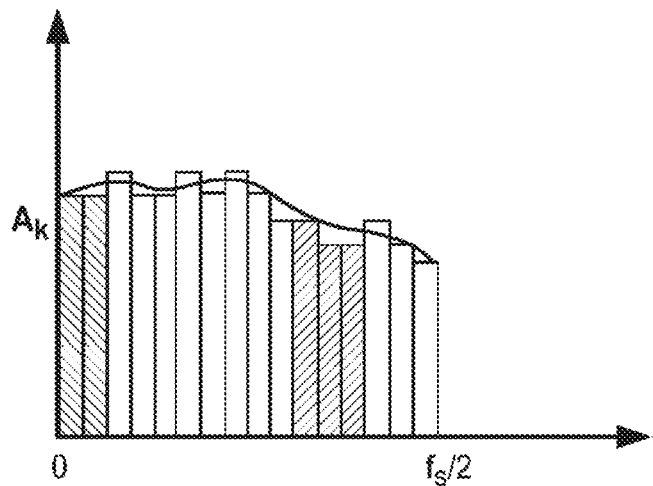
FIG. 3 shows a second sampled energy spectrum illustrating principles in accordance with the subject matter of this disclosure.

FIGS. 2 and 3 show two different sampled energy spectra 200, 300 that have different amounts of energy in each bin, with identical integrated energy totals, but different offset, low frequency gain, and sampling bandwidth or pulse width. From the perspective of a system which receives only the integrated energy total of these interleaver paths 113, the samples would be interpreted as identical, leading to higher Bit-Error-Rate (BER) among the individual interleaver paths 113 and in many cases worse overall average BER if the effects are sufficiently large.

After spectral analysis of the various interleaved samples, in various implementations the different attributes of each sample can be determined as follows:

First, offset mismatches between samples on different interleaver paths 113 are determined from Eq. 1 based on the content of Bin 0 of the sampled energy distribution.

Second, gain mismatches between samples on different interleaver paths 113 are determined from Eq. 2 based on the content of all bins, other than Bin 0, of the sampled energy distribution.

Third, signal width mismatches (i.e., bandwidth mismatches or pulse width mismatches) between samples on different interleaver paths 113 are determined from Eq. 3 based on spectral shape functions:

$$f(B_1^0, \ldots, B_{N-1}^0) = \ldots = f(B_1^{K-1}, \ldots, B_{N-1}^{K-1}) \qquad (3)$$

where f( . . . ) denotes a specialized spectral shape function that depends on the nature of signal and characteristics of the system.

Figure 4:
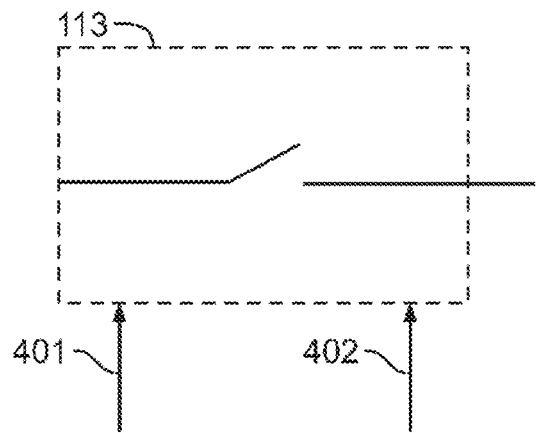
FIG. 4 shows details of an interleaver in accordance with the subject matter of this disclosure.
Figure 5:
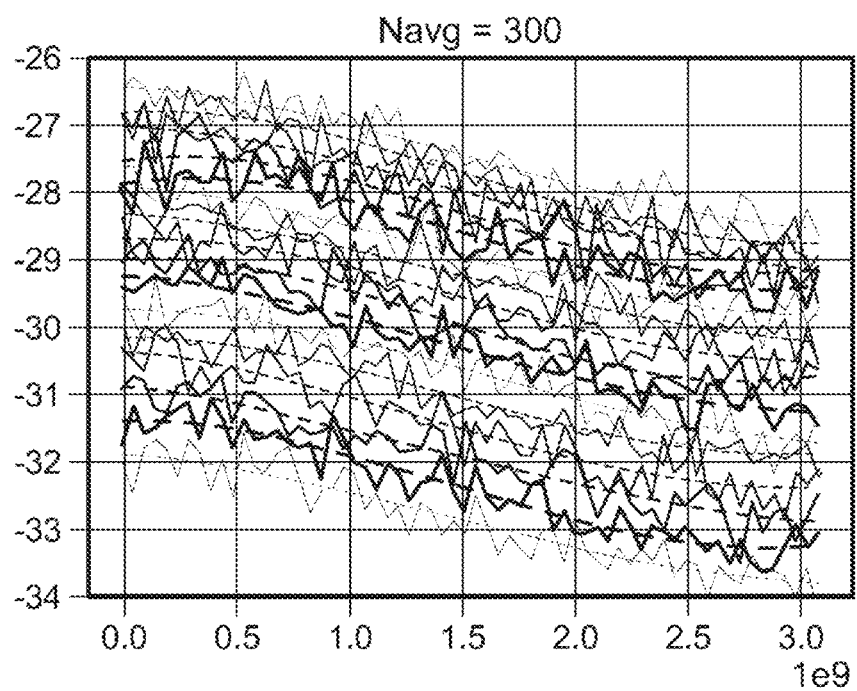
FIG. 5 shows spectral shapes resulting from linear gain sweep.
Figure 6:
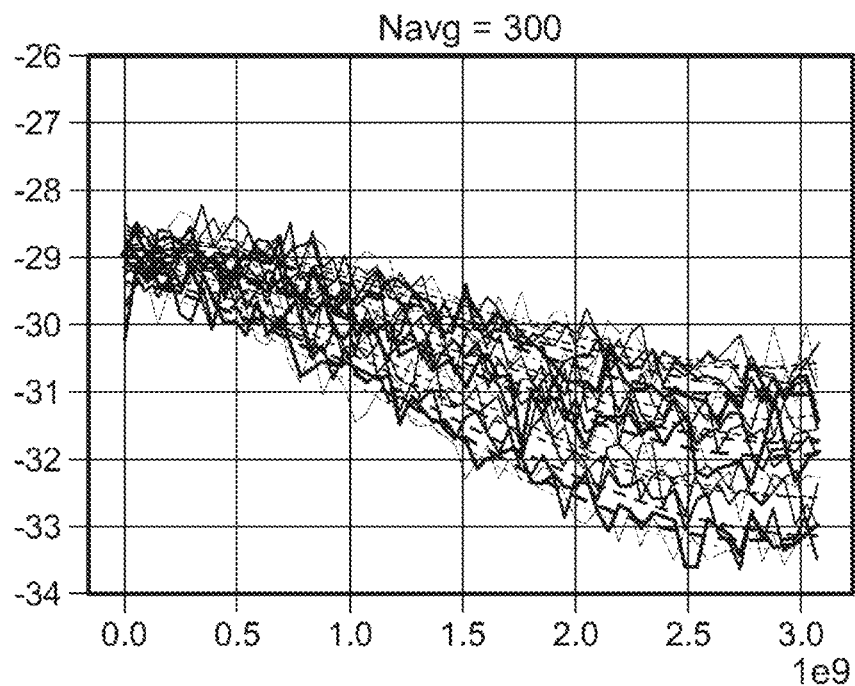
FIG. 6 shows spectral shapes resulting from sweeping bandwidth or pulse width.

In one implementation, a TI system may have K=16 interleaver paths 113 sampling at 100 GHz. Each interleaver path 113 thus runs at 6.25 GHz and is assumed to have a bandwidth of 40 GHz. Each interleaver 113 (FIG. 4) has a separate gain actuator 401 and separate bandwidth/pulse width actuators 402. Independently sweeping the different gain actuators 401 and bandwidth/pulse width actuators 402 of any of the interleavers 113, reveals two families of spectral curves with distinct signatures as shown in FIGS. 5 and 6. For example, FIG. 5 shows linear gain sweep spectral variation, and FIG. 6 shows bandwidth/pulse width spectral variation. In both FIGS. 5 and 6, solid lines denote actual spectral shapes, whereas dashed lines are corresponding smoothing fits. Spectral averaging may be used to partially suppress Gaussian noise present in the incoming random data as well as thermal noise of the system.

Figure 7:
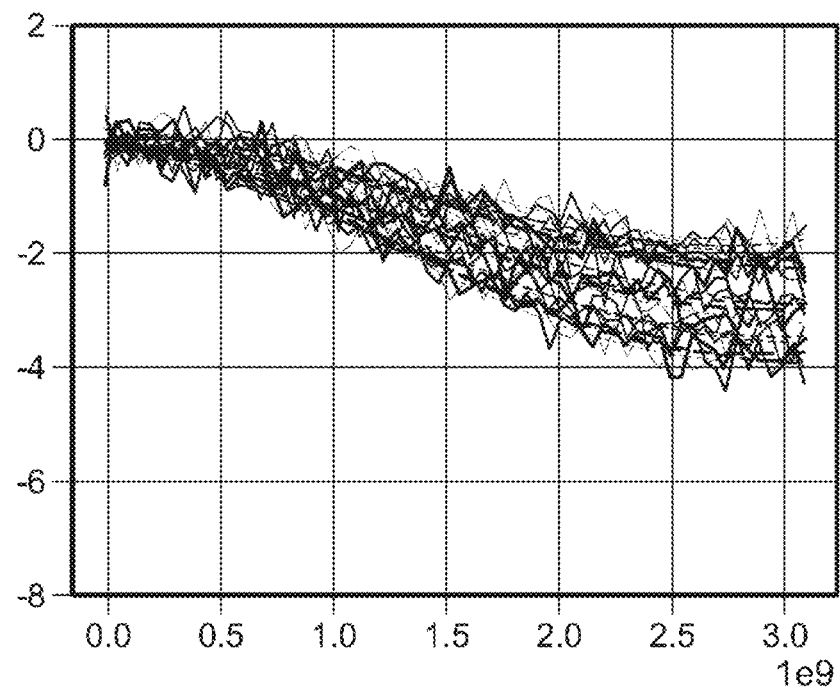
FIG. 7 shows gain-normalized spectral shapes.

Eq. 3 captures spectral shape as a specialized function f( . . . ) with the objective of equalizing the spectral shapes of FIG. 6. In one implementation, the first few bins of the interleaved spectral responses can be normalized, removing the linear gain component and subsequently relying on bandwidth/pulse width actuators 402 to equalize the post gain-normalized spectral shapes yielding the result shown in FIG. 7. In another implementation, fitting polynomial functions (illustrated by the dashed lines in FIG. 7) may be introduced and equalization can be performed using only high order coefficients.

Figure 8:
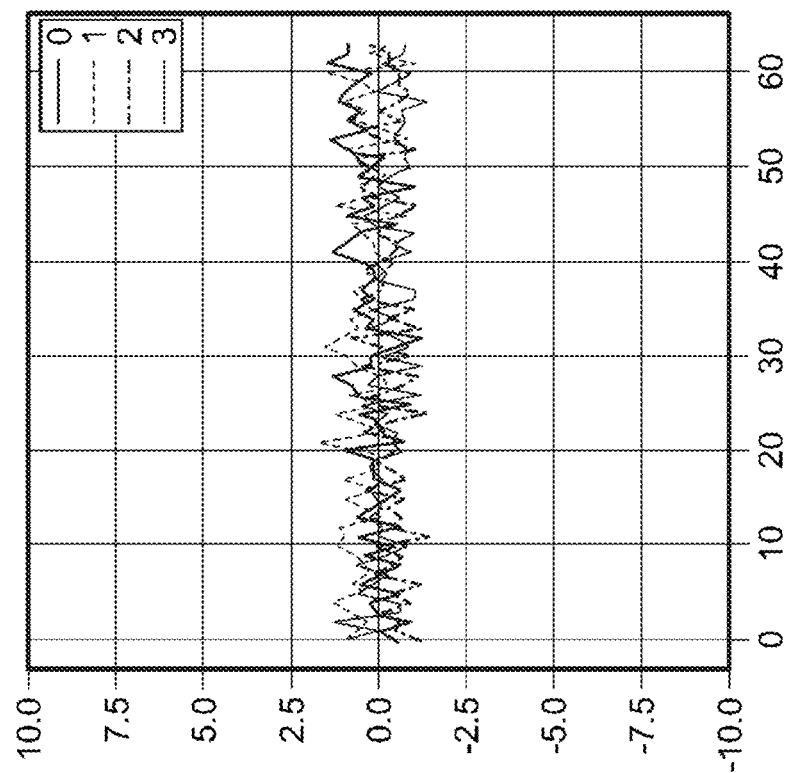
FIG. 8 shows measured spectral shapes after applying gain calibration.
Figure 9:
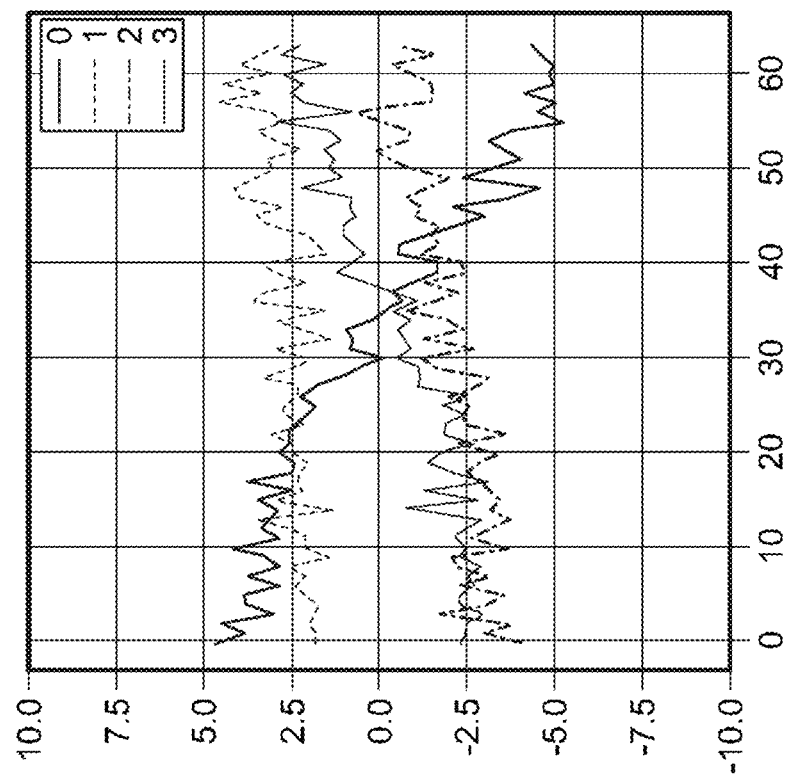
FIG. 9 shows measured spectral shapes after applying gain calibration and pulse width calibration.

A further illustration is shown in FIGS. 8 and 9. FIG. 8 shows measured spectral shapes from a system including a complete path with a transmitter, a channel, a printed circuit board, and receiver circuitry in an integrated circuit package, after applying specialized function f( . . . ), with gain calibration only, while FIG. 9 shows the measured spectral shapes with both gain and pulse width calibration. As seen, using both gain and pulse width calibration provides a superior result.

The discussion up to this point has treated pulse width variations and bandwidth variations as being the same. While this produces acceptable results in most cases because, to the first order, giving a system more time to settle is almost equivalent to increasing its bandwidth. In principle, however, mismatches resulting from different pulse width and bandwidth can produce different sensitivity functions with respect to spectral response changes. Thus, in another implementation, pulse width and bandwidth can be adjusted independently until respective sensitivity functions are equalized. This may be expressed mathematically as follows:

$$S_{plsw}^0 = S_{plsw}^1 = \cdots = S_{plsw}^{N-2} \ldots = S_{plsw}^{N-1} \text{ where } S_{plsw}^i = \frac{\Delta f(\ldots)}{\Delta PLSW_i} \quad \text{(Eq. 4 a)}$$

$$S_{bw}^0 = S_{bw}^1 = \cdots = S_{bw}^{N-2} \ldots = S_{bw}^{N-1} \text{ where } S_{bw}^i = \frac{\Delta f(\ldots)}{\Delta BW_i} \quad \text{(Eq. 4 b)}$$

As an example, sensitivity functions can be obtained by dithering the actuation code (of either bandwidth or pulse width) using minimal step sizes around the current code values and measuring the corresponding changes in the spectral shape function f( . . . ). After obtaining all the sensitivity functions, equal pulse widths and bandwidths are considered equalized when all respective sensitivity functions are equalized (Eq. 4) and Eqs. 1-3 also are satisfied.

Figure 10:
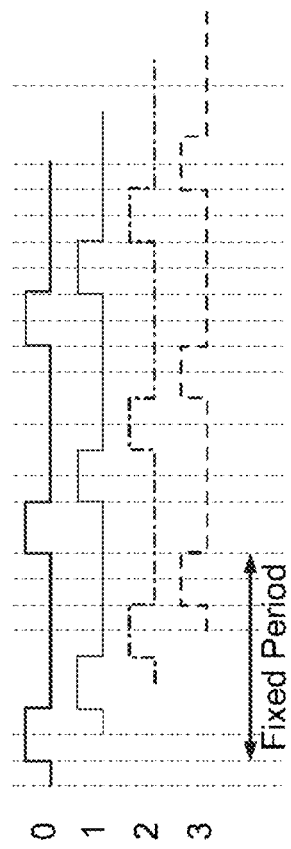
FIG. 10 shows a cyclic arrangement of sampling locations.
Figure 11:
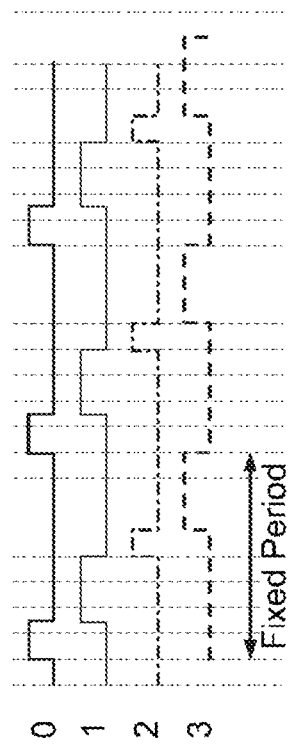
FIG. 11 shows a non-uniform arrangement of sampling locations.

In some implementations in which pulse widths and sampling locations form a cyclic arrangement (as illustrated in FIG. 10), the beginning-of-sampling for interleaver i is locked to the end-of-sampling of interleaver i−1. In such an implementation, if mismatches arise from non-uniform sampling locations as illustrated in FIG. 11, the mismatches can be detected by the spectral shape function f( . . . ) that is used to detect pulse width errors. Thus, in those implementations, adjusting for ideal sampling locations may be equivalent to adjusting for equal pulse widths across all interleavers.

Figure 12:
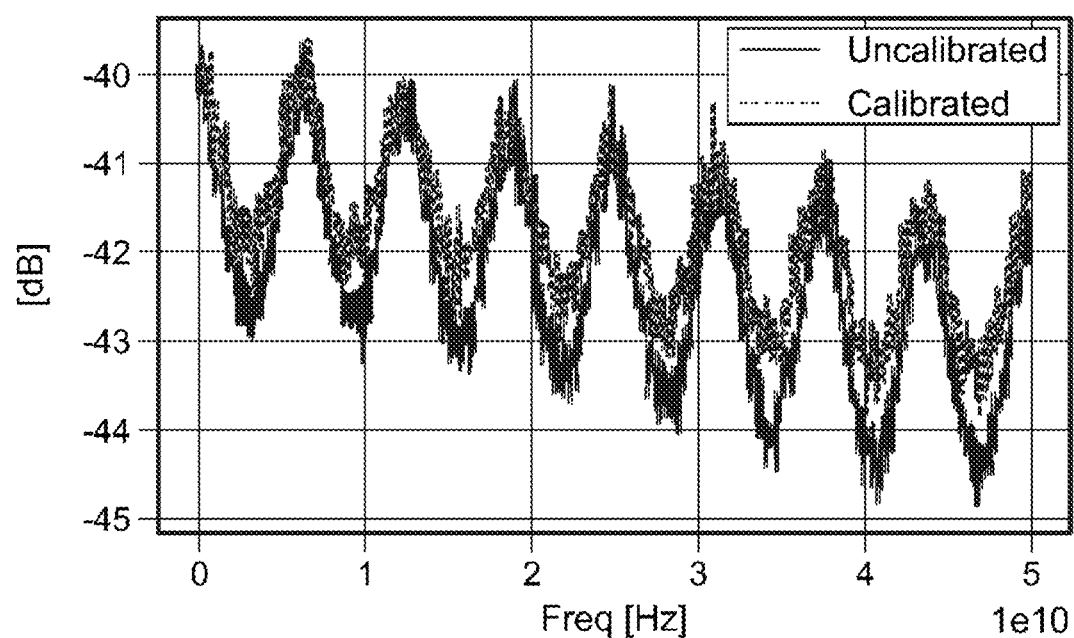
FIG. 12 shows the result of minimizing aggregated spectral response ripples.

In some implementations, overall broadband ripples of the aggregated spectrum matter more than the individual interleaving elements. Alternatively, if all samplers do not see the same incoming data statistics or if the sampling errors cause ISI, the individual bandwidths or pulse widths can be adjusted until ripple energy in the aggregated spectral shape is minimized. FIG. 12 shows the result of an implementation where the aggregated spectral response ripples are minimized. This application of spectral techniques can be particularly useful in systems where the system oversampling ratios (i.e., the ratio of sampling rate to data/symbol rate) can cause systematic mismatches as between individual interleavers 113 (e.g., because of their positions, certain interleavers may see more data zero crossings whereas other interleavers may see full data levels) or where sampling windows overlap/interact to lead to higher ISI.

A spectral estimator to determine the energy distribution can be implemented based on any suitable mathematical transformation capable of estimating the time or frequency dependent nature of a system, while highlighting interleaving artifacts. Some examples include Laplace transforms, Mellin transforms, etc.

In a particular implementation, the spectral estimator may be implemented using a Fast Fourier Transform (FFT). Several different Radix configurations can be selected with different practical considerations. Table 1 below lists the number of complex multiplications as a function of different FFT lengths based on specific Radix choices.

TABLE 1

Number of Real Multiplications Using a 4-Mult-2-Add Scheme

| FFT Length | Radix - 2/4 | Radix - 2/8 | Radix - 2/16 | Radix - 4/16 |
|---|---|---|---|---|
| 16 | 24 | 24 | 24 | 24 |
| 32 | 84 | 84 | 84 | |
| 64 | 248 | 240 | 248 | 248 |
| 128 | 660 | 636 | 652 | |
| 256 | 1656 | 1592 | 1632 | 1624 |
| 512 | 3988 | 3812 | 3924 | |
| 1024 | 9336 | 8896 | 9192 | 9144 |
| 2048 | 21396 | 20364 | 21020 | |
| 4096 | 48248 | 45832 | 47344 | 47000 |

The complex multiplications in this implementation are based on four real multiplications and two additions. One illustrative choice can be a Radix-2/8 Decimation-In-Frequency (DIF) implementation, with 636 multiplications. If the signal input is real, the number of multiplications can further be simplified. A DIF architecture may be more desirable than a Decimation-In-Time (DIT) implementation for several reasons. For example, data may be presented in a time-ordered sequence, whereas in a DIT architecture, the samples would need to be bit-reversed, adding to routing complexity. In addition, even though the DIF architecture presents the bins in bit-reversed order, the register interface can read out the bins in any order required.

Figure 13A:
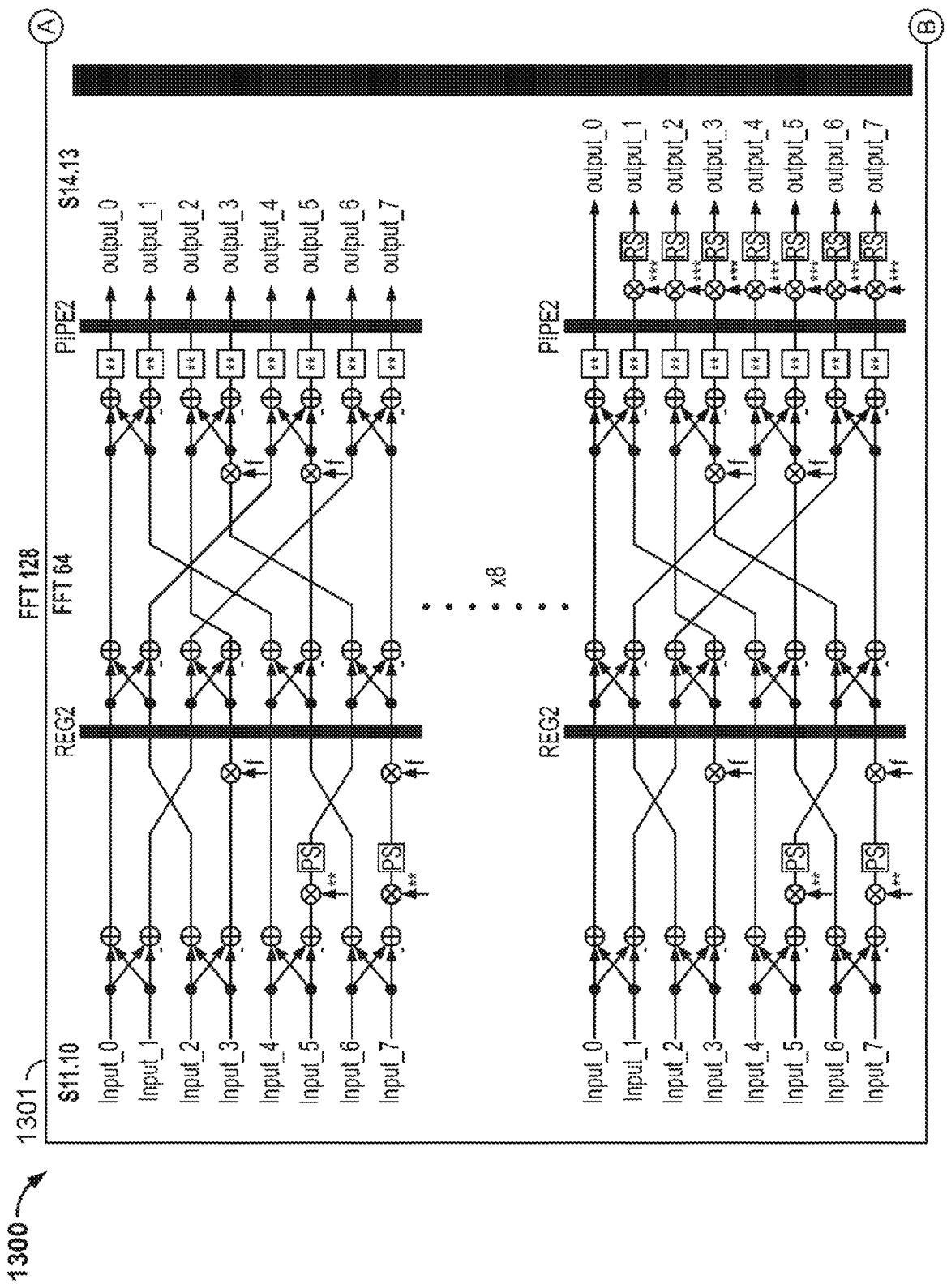
FIGS. 13A and 13B (hereafter collectively referred to as FIG. 13) show Fast Fourier Transform circuitry in accordance with an implementation of the subject matter of this disclosure.
Figure 13B:
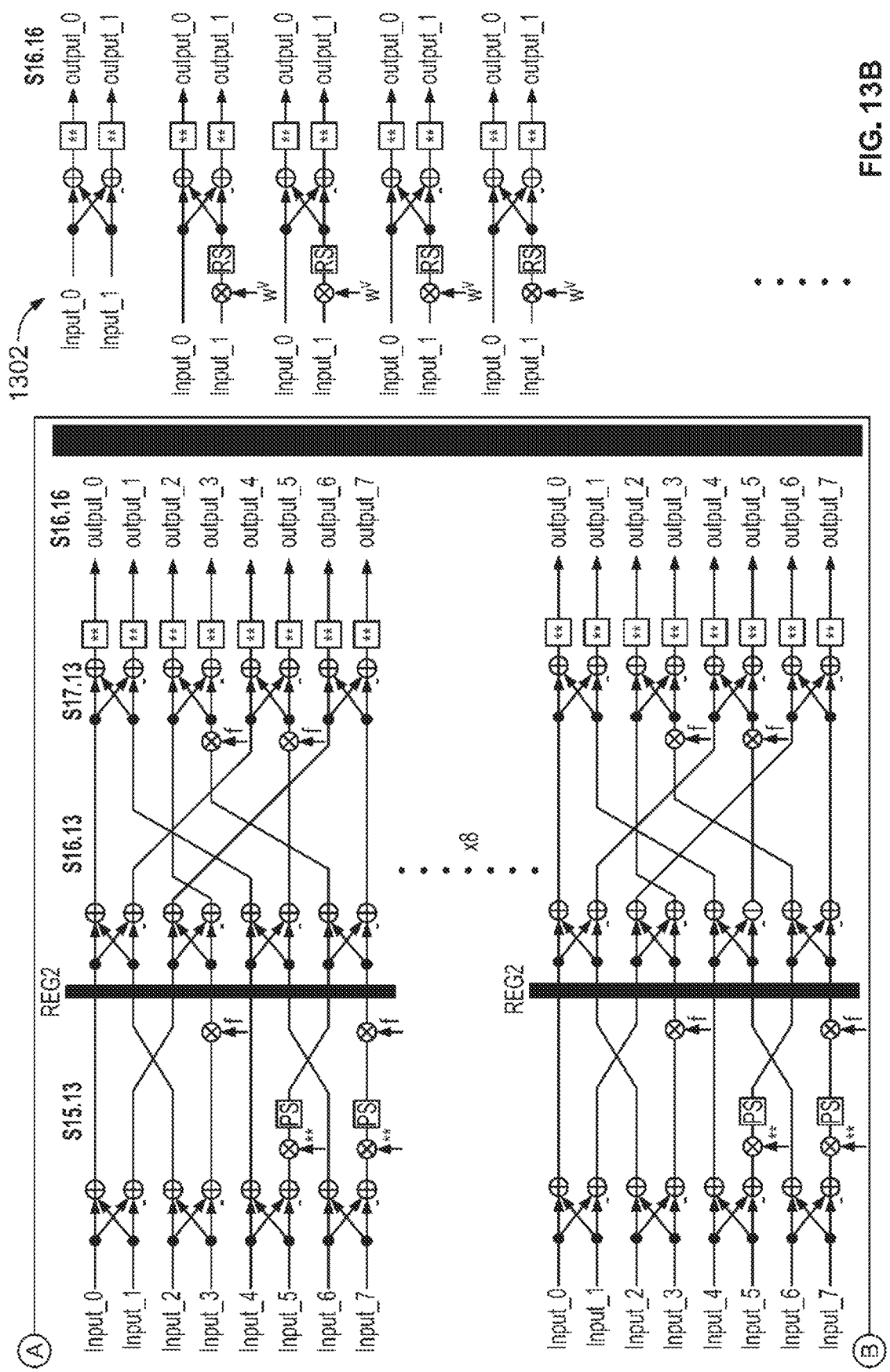

FIG. 13 illustrates a circuit implementation 1300 of a 128-point FFT. A cascade of two Radix-8 stages are repeated eight times to form one 64-point FFT 1301. A Radix-8 implementation is advantageous in that the twiddle-factors of a Radix-8 butterfly may be trivial operations. Non-trivial twiddle factors may be required only between the first and second cascades. Two 64-point FFT instances 1301 are fed to a final 2-point butterfly operation 1302 with non-trivial twiddle factors between the 64-point FFTs and the final stage. Further, the structure can be simplified as a real-only FFT, where the odd paths are not computed because the negative and positive spectrums are mirrored.

Six pipeline stages are present—five in the core of the logic and a final pipeline stage on the output—and are illustrated by vertical black lines. As many as 100,000+ FFT bins may be accumulated outside of the core for noise suppression. Further, to minimize the growth in quantization error, true symmetric rounding may be implemented throughout, adding minimal complexity to the design. Scaling through the FFT stages is a function of application scenarios and/or detection requirements, where dynamic-range requirements scale with accuracy. As an example, a simple symmetric rounding can take place at the output of the twiddle-factor multiplications, leading to an overall achievable dynamic range of greater than the intrinsic resolution of the transceiver.

Depending on applications, FFT results are further processed in signed or unsigned-square mode (in either interleaved or aggregated mode), depending on the design objective.

In signed mode, the real and imaginary components are taken as snapshot or separately summed while preserving their sign. For example, in a 48-bit accumulator with $2^{32}$ FFT averages each bin has a maximum range of $2^{16}$. Both magnitude and phase information are available, for applications where deterministic phase pattern in the incoming data needs to be tracked, aside from spectral shapes.

Unsigned square mode is similar to signed mode, except that the sum of the squares or absolutes of real and imaginary components are separately computed and accumulated. In a squared magnitude case, a higher theoretical maximum of accumulator bits with appropriate truncation may be required to achieve a similar accuracy. This mode may be used for high precision detection examples, where a high level of noise suppression is needed to discern different interleaving errors.

Two types of overflow detectors can be further added to detect overflow in any FFT-bin accumulator. The first type of overflow detector detects overflow in the accumulators of any DC bins, and the second type of overflow detector detects overflow in the remaining 63 bins. For each overflow detection method, one extra overflow bit is used in each accumulator. The MSB+1 of the accumulator may be monitored and any overflow events may be latched over a complete FFT processing cycle, which may include one or more successive FFTs, depending on the amount of required noise suppression.

In order to concurrently capture and process all interleavers, memory storage is also required, which may increase area footprint and routing complexity. As an example, a 128-point FFT core logic can be implemented with approximately 140,000 cells with additional storage up to 500,000 cells to accommodate interleaving parallelism and noise suppression requirements.

An example of memory requirements can be estimated as follows:

Total storage = Input-buffer-memory + FFT-core-storage + Bin-accumulator-memory
Input-buffer-memory = Interleaving-parallelism × number-of-bits-per-sample × number of interleavers
= 128 × 8 × 16 ≈ 16K bits
FFT-core-storage = (stage1-bits+stage2-bits+stage3-bits+stage4-bits+stage5-bits+stage6-bits) × FFT-size = (9 + 11 + 14 + 15 + 16 + 16)×128
≈ 10K bits
Bin-accumulator-memory = 2 * (FFT-size/2) × accumulator-bit-width × number of interleavers = 2 × (128/2) × 49 × 16 ≈ 100K bits With the design being memory-dominated, other choices such as folded FFT architectures provide minimum hardware savings over a full parallel implementation. Furthermore, a folded implementation would require programmable multipliers for the twiddle factors, thus adding complexity.

Figure 14:
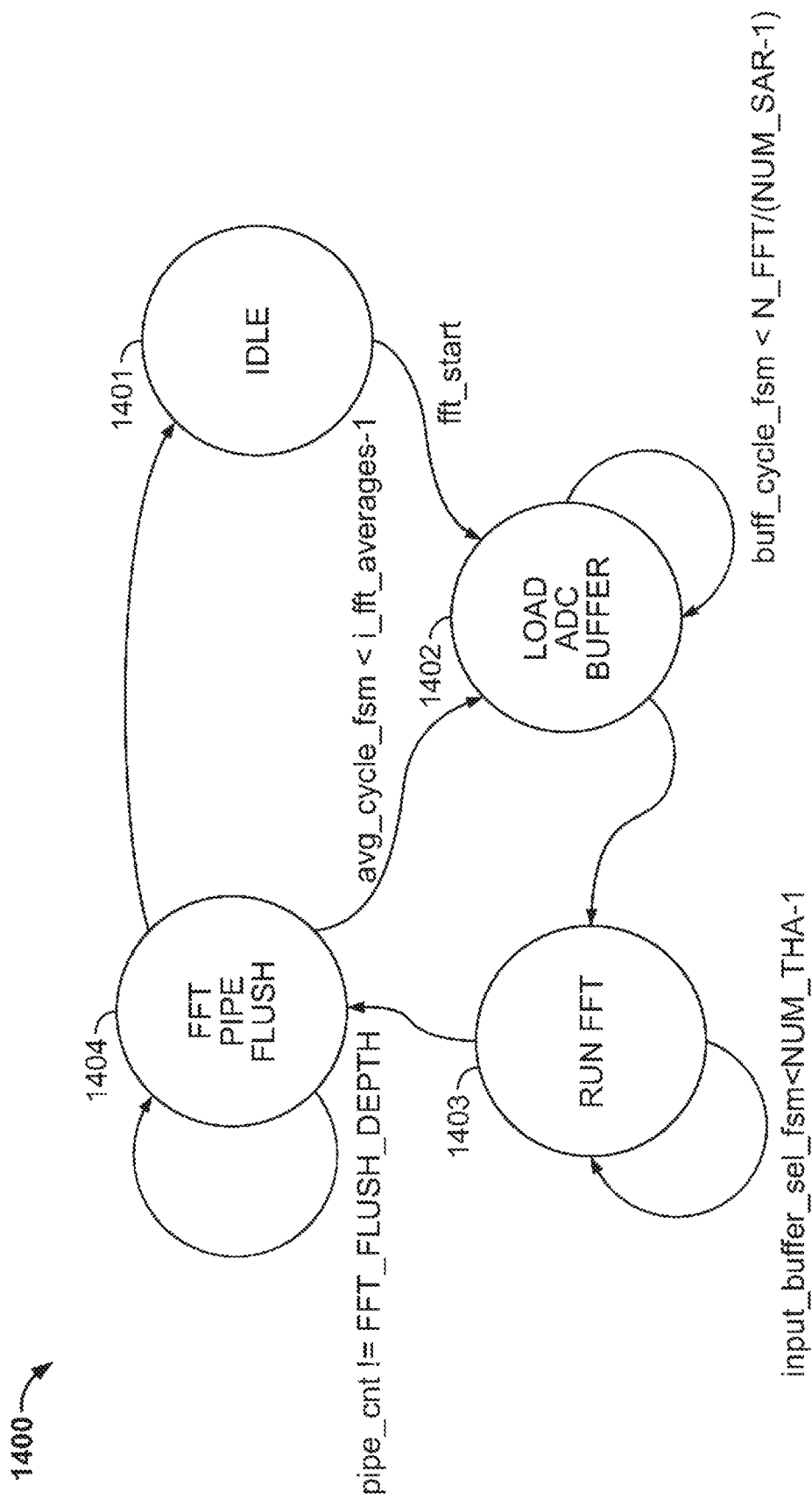
FIG. 14 shows a finite state machine in accordance with an implementation of the subject matter of this disclosure.

For timing purposes, an FFT cycle-time can be defined as the time to capture and perform K FFTs, which is the sum of LOAD+FFT+FLUSH time and is dependent on sampling rates. For example, the time for one full FFT computation at a sampling rate of 100 GS/s is ~164 ns. The latency can be calculated as follows:

LOAD+FFT+FLUSH time=(Num_THA×ADC_parallelism)/$f_{sample}$+(28×clk_div_factor)×(ADC_parallelism/$f_{sample}$)=ADC_parallelism/$f_{sample}$× (Number of THAs+28×clk_div_factor)

where the clk_div_factor denotes subsampling ratio (e.g. 4, 8, etc.). For example, at 100 GS/s, 100,000 FFT cycles can be performed in approximately 1.5 ms using a clock-divide ratio of 4. Additional logic may also be needed to ensure that the data-path pipeline operates in sync. An example finite-state-machine (FSM) 1400 that can be used to illustrate various control signals is shown in FIG. 14, where four simplified distinct states control the flow of the operation, as follows:

- Idle State 1401: During this state, the processer waits for an fft_start request. If successive fft_start requests are issued, these are ignored until the FFT has finished its current request cycle.
- Load-ADC-Buffer State 1402: K ADC buffers are filled at the parallel receiver maximum clock-rate. During this time the FFT core is idle. Clock-gating logic dynamically disables the core.
- Run-FFT State 1403: In this state, all K input buffers are sequentially processed using one FFT core. The input buffers are held static using dynamic clock-gating to save power. When the FFT pipeline is full, the post-FFT processing and accumulation commences. While the core pipeline is filling, the accumulators are disabled using dynamic clock-gating.
- FFT-Pipe-Flush State 1404: The internal pipeline of the FFT core is flushed during this state. The partially computed remaining FFT results in the pipeline are processed to completion and the remaining results stored in the bin accumulators. If the requested number of FFT bin-averaging cycles are incomplete the cycle repeats and the next Load-ADC-Buffer state is invoked. Otherwise, the FFT-done flag is asserted, and the FSM returns to idle.

Figure 15:
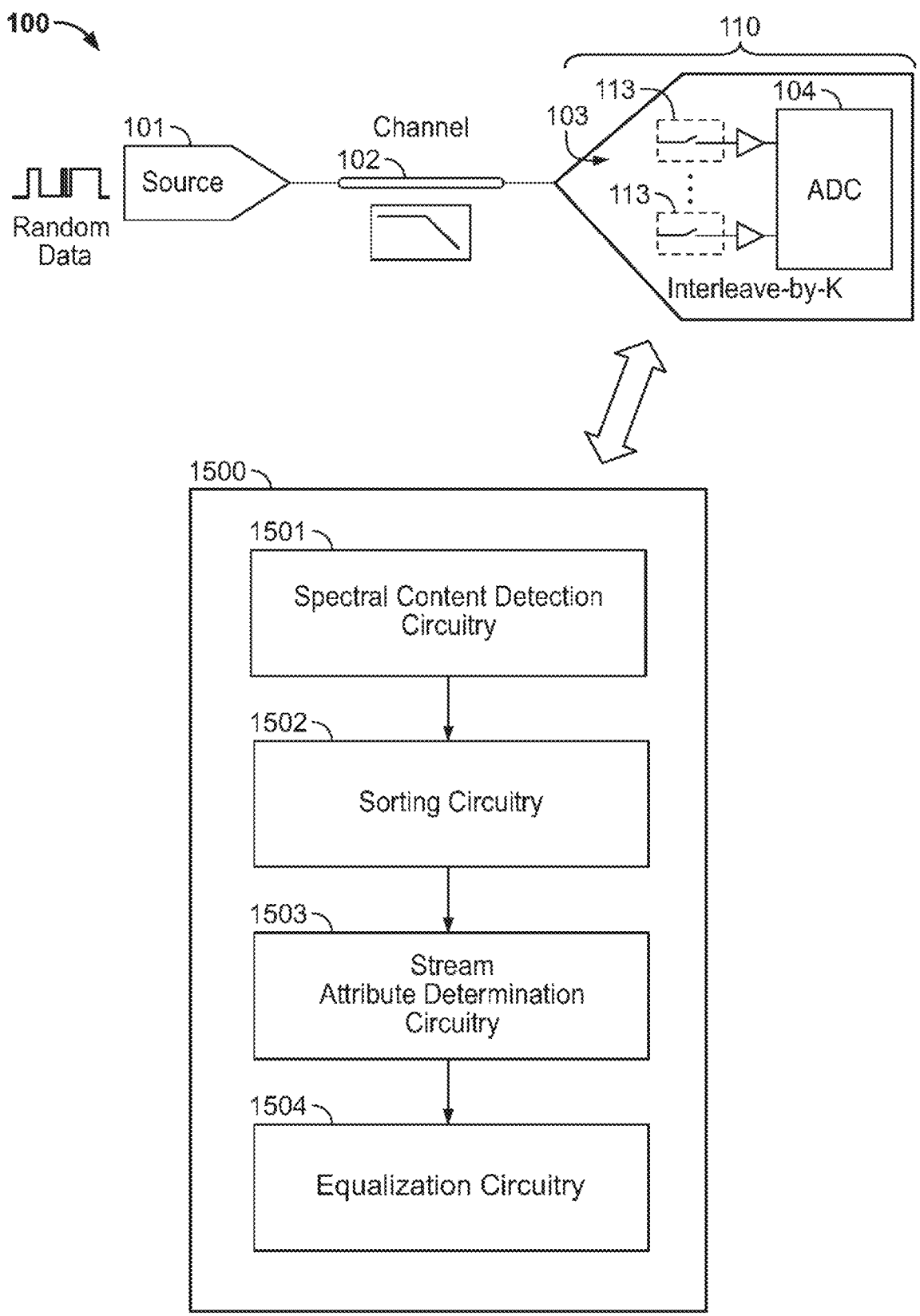
FIG. 15 shows the data channel of FIG. 1 incorporating control circuitry in accordance with implementations of the subject matter of this disclosure.

As seen in FIG. 15, receiver 110 incorporates control circuitry 1500. Control circuitry 1500 includes spectral content detection circuitry 1501 configured to derive spectral content information from data on each of the plurality of interleaved paths 113. Sorting circuitry 1502 operates on the derived spectral content information to bin the content information according to energy levels. Stream attribute determination circuitry 1503 determines, based on the sorted spectral content, one or more of path offsets of the interleaved paths 113, gain mismatch among interleaved paths 113, signal bandwidth mismatch and pulse width mismatch. Based on the output of stream attribute determination circuitry 1503, equalization circuitry 1504 corrects the one or more of the determined offsets, the determined gain mismatch and the determined signal width mismatch. Various functions of spectral content detection circuitry 1501, sorting circuitry 1502, stream attribute determination circuitry 1503 and equalization circuitry 1504 may be performed in whole or in part by FFT 1300 and FSM 1400, and portions of FFT 1300 and FSM 1400 may be incorporated in or divided between one or more of spectral content detection circuitry 1501, sorting circuitry 1502, stream attribute determination circuitry 1503 and equalization circuitry 1504.

Figure 16:
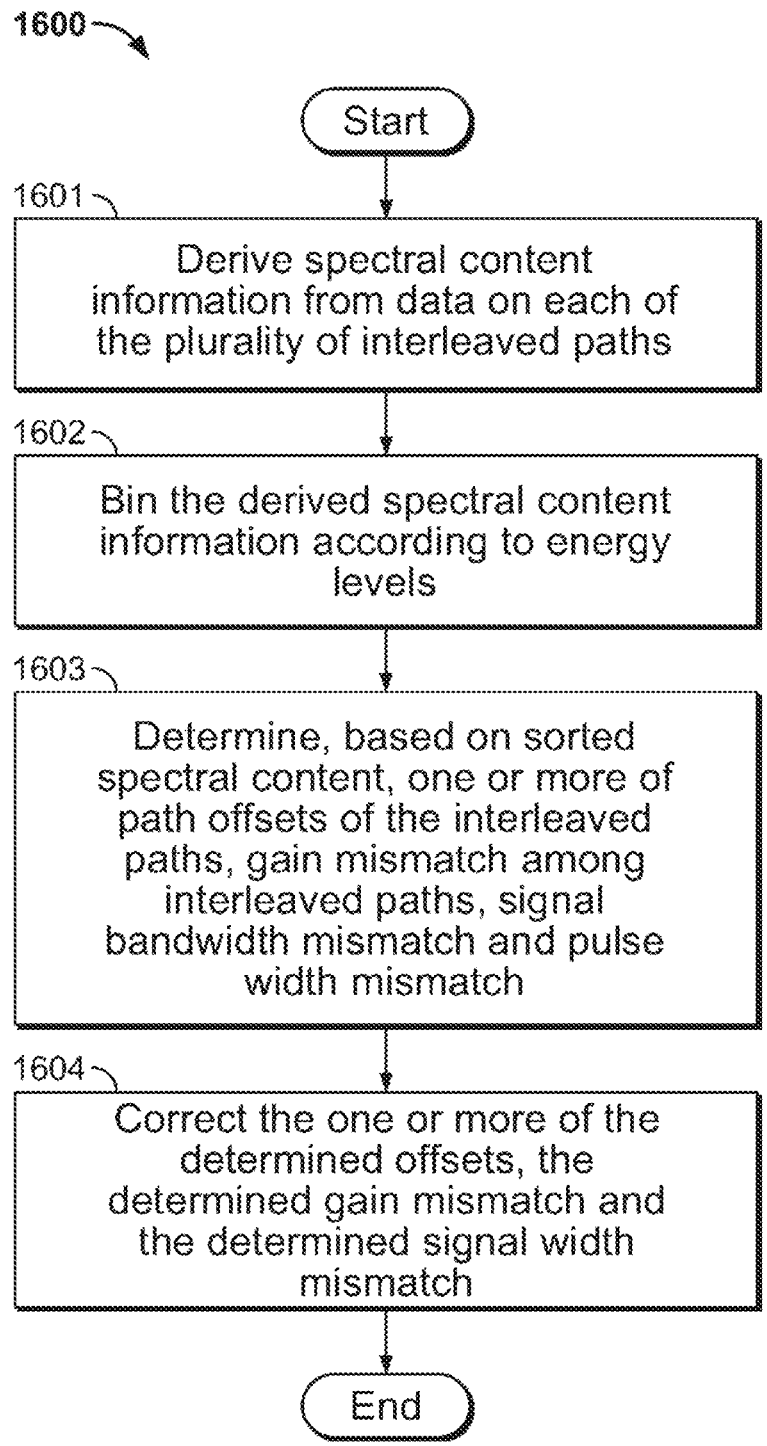
FIG. 16 is a flow diagram illustrating a method in accordance with implementations of the subject matter of this disclosure.

A method 1600 according to implementations of the subject matter of this disclosure, for equalizing parallel interleaved data paths in a high-speed data receiver is diagrammed in FIG. 16. Method 1600 begins at 1601, where spectral content information is derived from data on each of the plurality of interleaved paths. At 1602, the derived spectral content information is binned according to energy levels. At 1603, one or more of path offsets of the interleaved paths, gain mismatch among interleaved paths, signal bandwidth mismatch and pulse width mismatch, are determined based on sorted spectral content. At 1604, the one or more of the determined offsets, the determined gain mismatch and the determined signal width mismatch are corrected. Method 1600 then ends.

Thus it is seen that detection of mismatches between interleaved data paths based on sorted spectral data, and correction of the detected mismatches, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A high-speed data receiver comprising:
    interleaver circuitry configured to divide a received data stream into a plurality of interleaved data paths for processing;
    spectral content detection circuitry configured to derive spectral content information from data on each of the plurality of interleaved data paths;
    sorting circuitry configured to bin the derived spectral content information according to energy levels;
    stream attribute determination circuitry configured to determine, based on sorted spectral content, one or more of path offsets of interleaved data paths in the plurality of interleaved data paths, gain mismatch among interleaved paths in the plurality of interleaved data paths, signal bandwidth mismatch and pulse width mismatch, the stream attribute determination circuitry comprising signal width mismatch detection circuitry configured to determine at least one of the signal bandwidth mismatch and the pulse width mismatch using a spectral shape function; and
    equalization circuitry configured to correct the one or more of the determined offsets, the determined gain mismatch and the determined signal width mismatch.

2. The high-speed data receiver of claim 1, wherein the stream attribute determination circuitry comprises offset determination circuitry configured to determine offsets between the interleaved paths in the plurality of interleaved data paths from mismatches at a lowest energy level.

3. The high-speed data receiver of claim 1, wherein the signal width mismatch determination circuitry comprises circuitry configured to independently sweep respective signal width actuators of each respective interleaved path in the plurality of interleaved data paths.

4. The high-speed data receiver of claim 1, wherein the stream attribute determination circuitry comprises gain mismatch determination circuitry configured to determine the gain mismatches among the interleaved paths in the plurality of interleaved data paths from mismatches at energy levels above the lowest energy level.

5. The high-speed data receiver of claim 4 wherein the gain mismatch determination circuitry comprises circuitry configured to independently sweep respective gain actuators of each respective interleaved data path in the plurality of interleaved data paths.

6. The high-speed data receiver of claim 4, wherein the equalization circuitry is configured to remove the gain mismatches by normalizing a predetermined number of lowest-energy bins to provide a gain-normalized signal.

7. The high-speed data receiver of claim 6, wherein the equalization circuitry is configured to equalize the gain-normalized signal by adjusting respective signal width actuators of each respective interleaved data path in the plurality of interleaved data paths.

8. The high-speed data receiver of claim 7, wherein the equalization circuitry is configured to equalize the gain-normalized signal by separately adjusting respective bandwidth actuators of each respective interleaved data path in the plurality of interleaved paths and respective pulse width actuators of each respective interleaved data path in the plurality of interleaved data paths.

9. The high-speed data receiver of claim 7, wherein the equalization circuitry is configured to equalize the gain-normalized signal by adjusting sampling locations on each respective interleaved data path in the plurality of interleaved data paths.

10. The high-speed data receiver of claim 9, wherein the equalization circuitry is configured to equalize the gain-normalized signal by adjusting sampling locations on each respective interleaved data path in the plurality of interleaved data paths to set equal pulse widths on all interleaved paths.

11. The high-speed data receiver of claim 6, wherein the equalization circuitry is configured to equalize the gain-normalized signal by adjusting coefficients of a fitting polynomial.

12. The high-speed data receiver of claim 1 wherein the sorting circuitry comprises Fast Fourier Transform circuitry configured to derive the spectral content information from the data on each of the interleaved data paths in the plurality of interleaved data paths.

13. A method of equalizing interleaved data paths in a plurality of interleaved data paths in a high-speed data receiver, the method comprising:
deriving spectral content information from data on each interleaved data path in the plurality of interleaved data paths;
sorting the derived spectral content information into bins according to energy levels;
determining, based on sorted spectral content, one or more of path offsets of the interleaved data paths in the plurality of interleaved data paths, gain mismatch among the interleaved data paths in the plurality of interleaved data paths, signal bandwidth mismatch and pulse width mismatch, including at least determining mismatch in at least one of bandwidth and pulse width among the interleaved data paths in the plurality of interleaved data paths using a spectral shape function; and
correcting the one or more of the determined path offsets, the determined gain mismatch and the determined signal width mismatch.

14. The method of equalizing interleaved data paths in the plurality of interleaved data paths according to claim 13, wherein determining, based on the sorted spectral content, one or more of the path offsets of the interleaved data paths in the plurality of interleaved data paths, the gain mismatch among the interleaved data paths in the plurality of interleaved data paths, the signal bandwidth mismatch and the pulse width mismatch comprises determining offsets among the interleaved data paths in the plurality of interleaved data paths from mismatches at a lowest energy level.

15. The method of equalizing interleaved data paths in the plurality of interleaved data paths according to claim 13, wherein determining mismatch in at least one of bandwidth and pulse width comprises independently sweeping respective signal width actuators of each respective interleaved data path in the plurality of interleaved data paths.

16. The method of equalizing interleaved data paths in the plurality of interleaved data paths according to claim 13, wherein determining, based on sorted spectral content, one or more of the path offsets of the interleaved data paths in the plurality of interleaved data paths, the gain mismatch among interleaved data paths in the plurality of interleaved data paths, the signal bandwidth mismatch and the pulse width mismatch comprises determining gain mismatches among the interleaved data paths in the plurality of interleaved data paths from mismatches at energy levels above the lowest energy level.

17. The method of equalizing interleaved data paths in the plurality of interleaved data paths according to claim 16, wherein determining gain mismatches comprises independently sweeping respective gain actuators of each respective interleaved data path in the plurality of interleaved data paths.

18. The method of equalizing interleaved data paths in the plurality of interleaved data paths according to claim 16, wherein correcting the determined gain mismatch comprises removing the determined gain mismatch by normalizing a predetermined number of lowest-energy bins.

19. The method of equalizing interleaved data paths in the plurality of interleaved data paths according to claim 18, wherein correcting the determined signal width mismatch comprises adjusting respective signal width actuators of each respective interleaved data path in the plurality of interleaved data paths.

20. The method of equalizing interleaved data paths in the plurality of interleaved data paths according to claim 19, wherein correcting the determined signal width mismatch comprises separately adjusting respective bandwidth actuators of each respective interleaved data path in the plurality of interleaved data paths and respective pulse width actuators of each respective interleaved data path in the plurality of interleaved data paths.

21. The method of equalizing interleaved data paths in the plurality of interleaved data paths according to claim 19, wherein correcting the determined signal width mismatch comprises adjusting sampling locations on each respective interleaved data path in the plurality of interleaved data paths.

22. The method of equalizing interleaved data paths in the plurality of interleaved data paths according to claim 21, wherein correcting the determined signal width mismatch comprises adjusting sampling locations on each respective interleaved data path in the plurality of interleaved data paths to set equal pulse widths on all interleaved data paths in the plurality of interleaved data paths.

23. The method of equalizing interleaved data paths in the plurality of interleaved data paths according to claim 18, wherein correcting the determined signal width mismatch comprises adjusting coefficients of a fitting polynomial.

24. The method of equalizing interleaved data paths in the plurality of interleaved data paths according to claim 13 wherein sorting the derived spectral content information into bins according to energy levels comprises applying a Fast Fourier Transform.

* * * * *